United States Patent

Hasegawa et al.

[11] Patent Number: 5,910,344
[45] Date of Patent: Jun. 8, 1999

[54] METHOD OF MANUFACTURING A MAGNETORESISTIVE SENSOR

[75] Inventors: Naoya Hasegawa; Masamichi Saito; Akihiro Makino, all of Niigata-ken, Japan

[73] Assignee: Alps Electric Co., Ltd., Japan

[21] Appl. No.: 09/175,593

[22] Filed: Oct. 20, 1998

Related U.S. Application Data

[62] Division of application No. 08/944,665, Oct. 6, 1997.

[30] Foreign Application Priority Data

Oct. 7, 1996 [JP] Japan .................. 8-266359

[51] Int. Cl.[6] .................................. B29C 35/08
[52] U.S. Cl. ................. 427/599; 427/127; 427/130; 427/131; 427/132; 427/383.1; 427/404; 427/419.2
[58] Field of Search .................. 427/599, 127, 427/130, 131, 132, 383.1, 404, 419.2

[56] References Cited

U.S. PATENT DOCUMENTS

| | | |
|---|---|---|
| 4,103,315 | 7/1978 | Hempstead et al. . |
| 4,809,109 | 2/1989 | Howard et al. . |
| 5,159,513 | 10/1992 | Dieny et al. . |
| 5,287,238 | 2/1994 | Baumgart et al. . |
| 5,315,468 | 5/1994 | Lin et al. . |
| 5,373,238 | 12/1994 | McGuire et al. . |
| 5,380,548 | 1/1995 | Lin et al. . |
| 5,436,778 | 7/1995 | Lin et al. . |
| 5,528,440 | 6/1996 | Fontana et al. . |
| 5,563,752 | 10/1996 | Komuro et al. . |
| 5,583,725 | 12/1996 | Coffey et al. . |
| 5,608,593 | 3/1997 | Kim et al. . |
| 5,708,358 | 1/1998 | Ravipati . |
| 5,742,458 | 4/1998 | Koike et al. . |
| 5,768,067 | 6/1998 | Saito et al. . |

FOREIGN PATENT DOCUMENTS 08279117  10/1996  Japan .

OTHER PUBLICATIONS

"Improved Exchange Coupling Between Ferromagnetic Ni–Fe and Antiferromagnetic Ni–Mn–based Films", *American Institute of Physics*, Lin Tsann, et al., Aug., 1994 (pp. 1183–1185).

*Primary Examiner*—Bernard Pianalto
*Attorney, Agent, or Firm*—Brinks Hofer Gilson & Lione

[57] ABSTRACT

The present invention provides a magnetoresistive sensor having at least two ferromagnetic layers provided with a non-magnetic layer therebetween; a coercive force increasing layer consisting of an antiferromagnetic material and provided adjacent to one of the ferromagnetic layers, for increasing the coercive force thereof to pin magnetization reversal, the other ferromagnetic layer having free magnetization reversal; and an antiferromagnetic layer provided to adjacent to the other ferromagnetic layer having free magnetization reversal, for applying a longitudinal bias to the other ferromagnetic layer to induce magnetic anisotropy therein due to an unidirectional exchange bias magnetic field to stabilize a magnetic domain.

4 Claims, 8 Drawing Sheets

METHOD OF MANUFACTURING A MAGNETORESISTIVE SENSOR

This application is a division of application Ser. No. 08/944,665, filed Oct. 6, 1997.

BACKGROUND OF THE INVENTION

1. Field of the Invention

The present invention relates to a sensor comprising a magnetoresistive element and used as a magnetic head, a potentiosensor, an angular sensor, and the like, a manufacturing method thereof and a magnetic head comprising the sensor.

2. Description of the Related Art

As magnetoresistive reading heads (MR heads), AMR (Anisotropic Magnetoresistive) heads using the anisotropic magnetoresistive effect, and GMR (Giant Magnetoresistive) heads using spin dependent scattering are conventionally known. An example of the GMR heads is the spin-valve head disclosed in U.S. Pat. No. 5,159,513 in which high magnetoresistance is exhibited in a low magnetic field.

FIGS. 10 and 11 are drawings respectively showing the schematic constructions of AMR head element structures.

The head element shown in FIG. 10 comprises an insulation layer 2 and a ferromagnetic layer (AMR material layer) 3 which are laminated on a soft magnetic layer 1, antiferromagnetic layers 4 which are laminated at both ends of the ferromagnetic layer 3 with a space therebetween corresponding to a track width, and electrically conductive layers 5 respectively laminated on the antiferromagnetic layers 4. The head element shown in FIG. 11 comprises a soft magnetic layer 1, an insulation layer 2 and a ferromagnetic layer 3 which form a laminate, hard magnetic layers 6 provided on both sides of the laminate to hold it therebetween, and electrically conductive layers 5 respectively provided on the hard magnetic layers 6.

For optimum operation of such AMR heads, two magnetic bias fields are required for the ferromagnetic layer 3 exhibiting the AMR effect.

A first magnetic bias field functions to make the resistance of the ferromagnetic layer 3 change in linear response to a magnetic flux from a magnetic recording medium. The first magnetic bias field is perpendicular (in the Z direction shown in FIG. 1) to the surface of the magnetic recording medium and parallel to the film surface of the ferromagnetic layer 3. The first magnetic bias field is generally referred to as a "lateral bias" and can be obtained by flowing a sensing current through the ARM head element from the electrically conductive layers 5.

A second magnetic bias field is generally referred to as a "longitudinal bias" and applied in parallel (in the X direction shown in FIG. 1) with the film surface of the ferromagnetic layer 3. The longitudinal magnetic bias field is applied for suppressing the Barkhausen noise produced due to the formation of many magnetic domains in the ferromagnetic layer 3, i.e., causing the resistance to smoothly change with the magnetic flux from the magnetic recording medium with less noise.

However, in order to suppress the Barkhousen noise, it is necessary to put the ferromagnetic layer into a single magnetic domain state. As a method of applying the longitudinal bias for this purpose, the following two methods are generally known. A first method uses the head element structure shown in FIG. 11 in which the hard magnetic layers 6 are disposed on both sides of the ferromagnetic layer 3 to employ a leakage magnetic flux from the hard magnetic layers 6. A second method uses the head element structure shown in FIG. 10 in which the exchange anisotropic magnetic field produced in the contact boundary surfaces between the antiferromagnetic layers 4 and the ferromagnetic layer 3 is employed.

As an element structure which employs exchange anisotropic coupling due to the antiferromagnetic layers, the exchange bias structure shown in FIG. 12, and the spin-valve structure shown in FIG. 13 are known.

The structure shown in FIG. 12 is classified as the structure shown in FIG. 10, and comprises a ferromagnetic layer 22, a non-magnetic layer 23 and a ferromagnetic layer 24 exhibiting the magnetoresistive effect which are laminated on a lower insulation layer 21, antiferromagnetic layers 25 and lead layers 26 which are provided on both sides of the ferromagnetic layer 24 with a space corresponding to the track width TW, and an upper insulation layer 27 provided on these layers.

In the structure shown in FIG. 12, a longitudinal bias is applied to the ferromagnetic layer 24 due to the exchange anisotropic coupling in the boundaries between the ferromagnetic layer 24 and the antiferromagnetic layers 25 to put regions B (the regions where the ferromagnetic layer 24 contacts the antiferromagnetic layers 25) shown in FIG. 12 into a single magnetic domain state in the X direction. This brings region A of the ferromagnetic layer 24 within the track width into a single magnetic domain state in the X direction. A sensing current is supplied to the ferromagnetic layer 24 from the lead layers 26 through the antiferromagnetic layers 25. When the sensing current is supplied to the ferromagnetic layer 24, a lateral magnetic bias field in the Z direction is applied to the ferromagnetic layer 24 due to the magnetostatic coupling energy from the ferromagnetic layer 22. In this way, when the leakage magnetic filed is applied to the ferromagnetic layer 24 magnetized by the longitudinal magnetic bias field and the lateral magnetic bias field from the magnetic recording medium, the electric resistance to the sensing current linearly responds to the magnitude of the leakage magnetic field and changes in proportion thereto. Therefore, the leakage magnetic field can be sensed by a change in the electric resistance.

The structure shown in FIG. 13 comprises a free ferromagnetic layer 28, a non-magnetic electrically conductive layer 29 and a ferromagnetic layer 24 which are laminated to form a magnetoresistive element 19, and an antiferromagnetic layer 25 and an upper insulation layer 27 which are laminated in turn on the ferromagnetic layer 24.

In the structure shown in FIG. 13, the sensing current is supplied to the magnetoresistive element 19. The magnetization of the ferromagnetic layer 24 is fixed in the Z direction due to exchange anisotropic coupling with the antiferromagnetic layer 25. Therefore, when a leakage magnetic field is applied from a magnetic recording medium which is moved in the Y direction, the electric resistance of the magnetoresistive element 19 changes with a change in the magnetization direction of the free ferromagnetic layer 28, and the leakage magnetic field can thus be sensed by this change in the electric resistance.

Other known structures for optimum operation of the above structures by employing the spin valve structure include the structure shown in FIG. 14 which comprises a free ferromagnetic layer 7, a non-magnetic buffer layer 8, a pinned ferromagnetic layer 9 and an antiferromagnetic layer 10, which are laminated in turn to form a laminate, hard magnetic layers 11 which are provided on both sides of the laminate, and electrically conductive layers 12 respectively provided on the hard magnetic layers 11, and the structure shown in FIG. 15 which comprises a free ferromagnetic layer 7, a non-magnetic buffer layer 8, a pinned ferromagnetic layer 9 and an antiferromagnetic layer 10, which are laminated in turn to form a laminate, an electrically conductive layer 12 and an antiferromagnetic layer 13 which are provided on the upper and lower sides of the laminate to hold it therebetween at either side thereof, and a buffer layer 14 provided adjacent to the whole laminate.

In the structure shown in FIG. 14, it is necessary that the magnetization direction of the free ferromagnetic layer 7 is directed in the track direction (the X direction shown in FIG. 14) in the state where a bias in the track direction is applied to the free ferromagnetic layer 7 to put it into a single magnetic domain state by the hard magnetic layers 11, and that the magnetization direction of the pinned ferromagnetic layer 9 is directed in the Z direction shown in FIG. 14, i.e., the direction perpendicular to the magnetization direction of the free ferromagnetic layer 7, in the state where a bias is applied in the Z direction to put the pinned ferromagnetic layer 9 into a single magnetic domain state. In other words, the magnetization direction of the pinned ferromagnetic layer 9 must not be changed by a magnetic flux (in the Z direction shown in FIG. 14) from the recording magnetic medium, and the magnetization direction of the free ferromagnetic layer 7 is changed within the range of 90 ±θ° with the magnetization direction of the pinned ferromagnetic layer 9 to obtain linear response of magnetoresistance.

In order to fix the magnetization direction of the pinned ferromagnetic layer 9 in the Z direction shown in FIGS. 14 and 15, a relatively large bias magnetic field is required, and this bias magnetic field is preferably as large as possible. In order to overcome an antiferromagnetic field in the Z direction shown in FIGS. 14 and 15, and avoid fluctuation of the magnetization direction due to the magnetic flux from the recording magnetic medium, a bias magnetic field of at least 100 Oe is required.

In the structures shown in FIGS. 14 and 15, this bias magnetic field is obtained by using the exchange anisotropic coupling produced by providing the pinned ferromagnetic layer 9 and the antiferromagnetic layer 10 in contact with each other.

The bias applied to the free ferromagnetic layer 7 is adapted for securing linear response and suppressing the Barkhausen noise produced due to the formation of many magnetic domains. Like the longitudinal bias in an AMR head, the structure shown in FIG. 14 uses as the bias the leakage magnetic flux from the hard magnetic layers 11 which are provided on both sides of the free ferromagnetic layer 7. The structure shown in FIG. 15 uses as the bias the exchange anisotropic magnetic field produced in the contact boundary surfaces between the free ferromagnetic layer 7 and the antiferromagnetic layers 13 provided on both sides of the free ferromagnetic layer 7.

As described above, the exchange anisotropic magnetic field produced in the contact boundary with the antiferromagnetic layers is used as the longitudinal bias in the AMR head, the bias for the pinned ferromagnetic layer in a spin valve head, and the bias for the free ferromagnetic layer. As result, a magnetoresistive head exhibiting good linear response and the effect of suppressing Barkhausen noise is realized.

The exchange anisotropic magnetic field is the phenomenon caused by exchange interaction between the magnetizing moments of the ferromagnetic layer and the antiferromagnetic layer in the contact boundary layer therebetween. As the antiferromagnetic layer producing the exchange anisotropic magnetic field with the ferromagnetic layer, e.g., an NiFe layer, an FeMn layer is well known. However, the FeMn layer has a problem in that since it has low corrosion resistance, corrosion proceeds in the process of manufacturing a magnetic head and in operation of the magnetic head, thereby deteriorating the exchange anisotropic magnetic field, and damaging the recording magnetic medium in some cases. It is known that the temperature in the vicinity of the FeMn layer during operation of the magnetic head readily increases to about 120° C. by heat of the stationary sensing current. However, the exchange anisotropic magnetic field produced by the FeMn layer is extremely sensitive to a temperature change, and substantially linearly decreases with a temperature increase to about 150° C. at which it disappears (blocking temperature: Tb). There is also a problem in that a stable exchange anisotropic magnetic field cannot be obtained.

On the other hand, as an invention of improvements in the corrosion resistance and blocking temperature of an FeMn film, for example, the NiMn alloy or NiMnCr alloy having a face-centered tetragonal structure disclosed in U.S. Pat. Nos. 5,315,468 and 5,436,778 is known. However, the corrosion resistance of an NiMn layer is higher than that of the FeMn layer, but is insufficient for practical use. An NiMnCr layer contains Cr which is added for improving the corrosion resistance of the NiMn layer, but has a problem in that although the corrosion resistance is improved by adding Cr, the magnitude of the exchange anisotropic magnetic field and the blocking temperature are decreased.

Further, in order to obtain the exchange anisotropic magnetic field in the NiMn alloy or NiMnCr alloy, it is necessary to form a CuAg—I type ordered structure crystal having the face-centered tetragonal (fct) structure in a portion of the antiferromagnetic layer, and it is, of course, necessary to control ordered-disordered transformation and the volume ratio of ordered phase and disordered phase. Therefore, there is a problem in that in order to obtain stable properties, control and management of the process for manufacturing a magnetic head must be significantly complicated. There are also problems in that in order to obtain the necessary exchange anisotropic magnetic field, heat treatment in a magnetic field must be repeated several times, and in that the temperature must be decreased at a low rate, for example, a time required for decreasing the temperature from 255° C. to 45° C. is 17 hours (refer to Appl. Phys. Lett., 65(9), Aug. 29, 1994). Thus the treatment time in the manufacturing process is increased, and the efficiency of manufacture deteriorates.

As an invention of improvement in the blocking temperature of the FeMn layer, a method is disclosed in U.S. Pat. No. 4,809,109 in which a NiFe/FeMn laminated film is heat-treated at a temperature of 260 to 350° C. for 20 to 50 hours to form a Ni—Fe—Mn three-element alloy layer in the NiFe/FeMn boundary surface due to diffusion by heat treatment. However, it can be understood that this method has no effect on improvement in corrosion resistance which is the greatest problem, and this method has a problem in that the required heat treatment time is as long as 20 to 50 hours, and thus deteriorates the efficiency of manufacture.

On the other hand, Mn system alloys such as NiMn, PtMn, AuMn, RhMn$_3$ and the like are shown as antiferromagnetic materials in an existing publication, e.g., "Magnetic Material Handbook" issued by Asakura Shoten. However, there is no comment about an exchange anisotropic magnetic field in the contact boundary surface with the ferromagnetic layer, and characteristics of an antiferromagnetic layer itself and exchange anisotropic magnetic field in a super thin film having a thickness of several hundreds Å are not entirely clear.

In the element structure shown in FIG. 14, the free ferromagnetic layer 7 to which the bias is applied by the right and left hard magnetic layers 11 tends to become an insensitive region where the magnetization direction in the track end portions (the region denoted by reference numeral 16 in FIG. 14) near the hard magnetic layers 11 is hardly changed. Therefore, when the track width is decreased with improvement in the recording density of the recording magnetic medium, this structure possible causes a problem.

The element structure using an exchange coupling bias shown in FIG. 15 can thus become promising, but the structure has the problem below when a longitudinal bias is applied to the spin valve element structure by the exchange coupling bias method.

In the spin valve element structure shown in FIG. 15, rotation of magnetization of the pinned ferromagnetic layer 9 is fixed by the antiferromagnetic layer 10. While the magnetization direction of the track end portions of the free ferromagnetic layer 7 is fixed for the longitudinal bias by the antiferromagnetic layers 13. A difference between the magnetization directions in which the antiferromagnetic layer 10 and the antiferromagnetic layers 13 are respectively fixed is 90°.

The magnetization direction of each of the magnetic layers is generally controlled by deposition in a magnetic field or annealing in a magnetic field after deposition. However, it is very difficult to control the magnetization direction of the antiferromagnetic layer 10 which is deposited after the antiferromagnetic layers 13 are deposited, without disturbing the magnetization direction of the antiferromagnetic layers 13.

Also a technique is disclosed in U.S. Pat. No. 5,528,440 in which the above problems are solved by using magnetic films having different Neel temperatures and employing different heat treatment temperatures for the respective magnetic films. However, this technique also has the need for using an FeMn alloy having a low Neel temperature, and thus has a problem in that the drawback of low corrosion resistance and the drawback of sensitivity to a temperature change due to the blocking temperature cannot be solved.

SUMMARY OF THE INVENTION

The present invention has been achieved in consideration of the above situation, and an object of the invention is to provide a magnetoresistive sensor with excellent corrosion resistance and linear response in which a necessary sufficient exchange anisotropic magnetic field can be applied in a thin film, and Barkhousen noise is suppressed.

Another object of the present invention is to provide a magnetoresistive sensor in which by providing an antiferromagnetic layer having a high blocking temperature, the linear response and resistance to temperature changes are improved and Barkhousen noise is suppressed.

A further object of the present invention is to provide a method of manufacturing a magnetoresistive sensor having the above excellent properties, which has no need for heat treatment in a magnetic field for a long time using special heat treatment equipment, which can manufacture the sensor by usual heat treatment, and which can reduce the heat treatment time, as compared with a conventional method.

In order to achieve the objects of the present invention, there is provided a magnetoresistive sensor comprising at least two ferromagnetic layers provided with a non-magnetic layer therebetween; a coercive force increasing layer comprising a first antiferromagnetic layer provided adjacent to one of the ferromagnetic layers, for increasing the coercive force of that ferromagnetic layer to pin magnetization reversal thereof, the other ferromagnetic layer having freed magnetization reversal; and a second antiferromagnetic layer comprising an antiferromagnetic material provided adjacent to the other ferromagnetic layer having freed magnetization reversal, for applying a longitudinal bias to the other ferromagnetic layer to induce unidirectional magnetic anisotropy to stabilize a magnetic domain.

In the present invention, the magnetization direction of the ferromagnetic layer having pinned magnetization reversal is preferably substantially perpendicular to the magnetization direction of the ferromagnetic layer having free magnetization without an external magnetic field.

In the present invention, the coercive force increasing layer comprises $\alpha\text{-Fe}_2\text{O}_3$, and the coercive force of the ferromagnetic layer having magnetization reversal pinned by the coercive force increasing layer is preferably higher than the unidirectional exchange bias magnetic field simultaneously induced in the ferromagnetic layer by $\alpha\text{-Fe}_2\text{O}_3$.

DESCRIPTION OF THE PREFERRED EMBODIMENT

Figure 1:
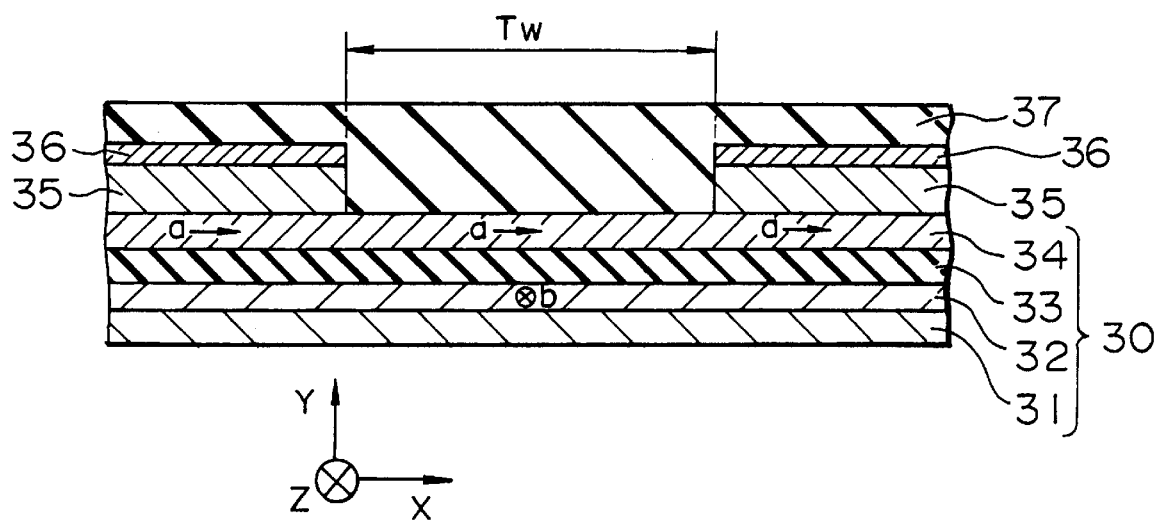
FIG. 1 is a sectional view showing a magnetoresistive sensor in accordance with a first embodiment of the present invention.

In order to achieve the objects of the present invention, there is provided a magnetoresistive sensor comprising at least two ferromagnetic layers provided with a non-magnetic layer therebetween; a coercive force increasing layer comprising a first antiferromagnetic layer provided adjacent to one of the ferromagnetic layers, for increasing the coercive force of that ferromagnetic layer to pin magnetization reversal thereof, the other ferromagnetic layer having freed magnetization reversal; and a second antiferromagnetic layer comprising an antiferromagnetic material provided adjacent to the other ferromagnetic layer having freed magnetization reversal, for applying a longitudinal bias to the other ferromagnetic layer to induce unidirectional magnetic anisotropy to stabilize a magnetic domain.

In the present invention, the magnetization direction of the ferromagnetic layer having pinned magnetization reversal is preferably substantially perpendicular to the magnetization direction of the ferromagnetic layer having freed magnetization without an external magnetic field.

In the present invention, the coercive force increasing layer comprises $\alpha\text{-Fe}_2\text{O}_3$, and the coercive force of the ferromagnetic layer having magnetization reversal pinned by the coercive force increasing layer is preferably higher than the unidirectional exchange bias magnetic field simultaneously induced in the ferromagnetic layer by $\alpha\text{-Fe}_2\text{O}_3$.

In the present invention, the second antiferromagnetic layer for applying the longitudinal bias is preferably provided on either end side of the magnetic sensing region of the other ferromagnetic layer having free magnetization reversal with a space, which equals to the predetermined track width corresponding to the width of the magnetic sensing region, so as to be adjacent to the other ferromagnetic layer.

In the present invention, the ferromagnetic layer having free magnetization reversal is formed with the width of the magnetic sensing region corresponding to the track width, and a laminate of an antiferromagnetic layer and another ferromagnetic layer laminated on this antiferromagnetic layer is formed on either side of the other ferromagnetic layer having free magnetization reversal to apply the longitudinal bias to the other ferromagnetic layer.

Further, the ferromagnetic layer laminated on the second antiferromagnetic layer for applying the longitudinal bias preferably comprises an amorphous thin film.

The antiferromagnetic layer for applying the longitudinal bias preferably comprises a X—Mn alloy (wherein X indicates at least one of Pt, Pd, Ir, Ru and Rh) type alloy thin film.

The present invention further provides a magnetic head comprising the magnetoresistive sensor constructed as described above.

On the other hand, when manufacturing the magnetoresistive sensor in which the second antiferromagnetic layers for applying the longitudinal bias are provided on both end sides of the magnetic sensing region of the ferromagnetic layer having free magnetization reversal opposite to each other with a space therebetween, which equals to the predetermined track width corresponding to the width of the magnetic sensing region, so as to contact the ferromagnetic layer, preferred conditions are the following:

The unidirectional magnetic anisotropy induced in the ferromagnetic layer having free magnetization reversal which is provided adjacent to the second antiferromagnetic layer for applying the longitudinal bias is produced by forming the ferromagnetic layer while applying a magnetic field or effecting heat treatment in a magnetic field after the formation of the ferromagnetic layer; and the magnetization direction of the ferromagnetic layer having pinned magnetization reversal which is provided adjacent to the coercive force increasing layer is determined in the permanent magnetization step after the step for determining the direction of the magnetic anisotropy of the ferromagnetic layer having free magnetization reversal.

When manufacturing the magnetoresistive sensor in which the ferromagnetic layer having free magnetization reversal is formed with the width of the magnetic sensing region corresponding to the track width, and a laminate of the antiferromagnetic layer of an antiferromagnetic material and another ferromagnetic layer is formed on either side of the ferromagnetic layer to apply the longitudinal bias, preferred conditions are the following:

The unidirectional magnetic anisotropy induced in the ferromagnetic layer which is provided adjacent to the antiferromagnetic layer to form each laminate is produced by forming the ferromagnetic layer while applying a magnetic field or effecting heat treatment in a magnetic layer after formation of the ferromagnetic layer; and the magnetization direction of the ferromagnetic layer having pinned magnetization reversal which is provided adjacent to the coercive force increasing layer is determined in the permanent magnetization step after the step for determining the direction of magnetic anisotropy of the ferromagnetic layer of each laminate.

An embodiment of the present invention will be described below with reference to the drawings.

FIG. 1 shows a magnetoresistive sensor in accordance with an embodiment of the present invention. The magnetoresistive sensor comprises a coercive force increasing layer 31, a ferromagnetic layer 32, a non-magnetic layer 33 and a ferromagnetic layer 34 which are laminated in turn on the coercive force increasing layer 31, antiferromagnetic layers 35 laminated on both ends of the ferromagnetic layer 34 with a space therebetween corresponding to the track width TW, lead layers 36 respectively laminated on the antiferromagnetic layers 35, and an upper insulation layer 37 laminated to cover the lead layers 36 and the ferromagnetic layer 34. In the structure of this embodiment, the coercive force increasing layer 31, the ferromagnetic layer 32, the non-magnetic layer 33 and the ferromagnetic layer 34 constitute a spin-valve magnetoresistive element 30.

The coercive force increasing layer 31 acts magnetic exchange coupling force on the ferromagnetic layer 32 formed thereon to increase the coercive force of the ferromagnetic layer 32 and pin the magnetization direction thereof. The coercive force increasing layer 31 comprises $\alpha\text{-Fe}_2\text{O}_3$ having a high Neel temperature.

Each of the ferromagnetic layers 32 and 34 comprises a thin film of a ferromagnetic material, particularly, an Ni—Fe alloy, a Co—Fe alloy, an Ni—Co alloy, Co, an Ni—Fe—Co alloy or the like. Alternatively, the ferromagnetic layer 32 may comprise a Co layer, and the ferromagnetic layer 34 may comprise an Ni—Fe alloy layer or a laminated structure of a Co layer and an Ni—Fe alloy layer. In the case of a two-layer structure of a Co layer and an Ni—Fe alloy layer, a thin Co layer may be disposed on the non-magnetic layer side.

This is because in a giant magnetoresistive effect generating mechanism having a structure comprising the non-magnetic layer 33 held between the ferromagnetic layers 32 and 34, the Co/Cu boundary surface has the large spin-dependent scattering effect of conduction electrons, and a structure comprising the ferromagnetic layers 32 and 34 made of the same material has the lower possibility of causing factors other than the spin-dependent scattering of conduction electrons and a higher magnetoresistive effect than a structure comprising the ferromagnetic layers made of different materials. For this reason, when the ferromagnetic layer 32 comprises Co, it is preferable that a Co layer having a predetermined thickness is provided on the non-magnetic layer side of the ferromagnetic layer 34. Alternatively, the ferromagnetic layer 34 may have a concentration gradient layer in which the non-magnetic layer side of the ferromagnetic layer 34 is put into an alloy state containing much Co, and the Co concentration gradually decreases toward the upper protective layer side, without a Co layer separately provided.

The non-magnetic layer 33 comprises a non-magnetic material such as Cu, Cr, Au, Ag or the like, and is formed to a thickness of 20 to 40 Å. If the thickness of the non-magnetic layer 33 is less than 20 Å, magnetic coupling easily occurs between the ferromagnetic layers 32 and 34. If the thickness of the non-magnetic layer 33 exceeds 40 Å, the ratio of conduction electrons which are scattered in the boundary surfaces between the non-magnetic layer 3 and the ferromagnetic layers 32 and 34 and which cause the magnetoresistive effect is decreased, thereby undesirably decreasing the magnetoresistive effect due to the shunt effect of a current.

The antiferromagnetic layers 35 preferably comprise an antiferromagnetic material different from the antiferromagnetic layer 31, for example, a X—Mn alloy having a disordered structure. In this composition formula, X is preferably at least one of Ru, Rh, Ir, Pd and Pt.

The Mn system alloy has a disordered crystal structure which means a state other than ordered crystal structures such as the face-centered tetragonal structure (fct ordered lattice; CuAuI structure and the like). Namely, the Mn alloy used in the present invention is not subjected to heat treatment at high temperature for a long time for making it an ordered crystal structure (the CuAuI structure or the like) such as the face-centered tetragonal structure after a film of the Mn alloy is deposited by sputtering. The disordered crystal structure means a state where the film is formed by a deposition method such as sputtering without further treatment, or a state the deposited film is then annealed.

When X in the X—Mn alloy denotes a single metal atom, the X contents of Ru, Rh, Ir, Pd and Pt are preferably within the ranges of 10 to 45 atomic %, 10 to 40 atomic %, 10 to 40 atomic %. 10 to 25 atomic % and 10 to 25 atomic %, respectively. In these ranges, 10 to 45 atomic % means not less than 10 atomic % and not more than 45 atomic %, and the upper and lower limits of all numerical ranges indicated by " " are defined by "not less than" and "not more than", respectively.

The antiferromagnetic layers 35 of the X—Mn type alloy having the disordered crystal structure are capable of applying the longitudinal bias to the ferromagnetic layer 34 due to unidirectional anisotropy, and pinning the rotation of magnetization at both ends of the ferromagnetic layer 34 which contacts the ferromagnetic layers 35.

Also the antiferromagnetic layers 35 of the X—Mn system alloy have excellent corrosion resistance and less variation in the exchange anisotropic magnetic field (Hex) with a temperature change, as compared with conventional antiferromagnetic layers of Fe—Mn. Therefore, the use of the antiferromagnetic layers 35 improves environmental resistance, prevents the occurrence of noise in detection of the leakage magnetic field from a recording magnetic medium and enables high-quality magnetic detection. Since the antiferromagnetic layers 35 of the X—Mn alloy has no need for heat treatment at high temperature for a long time, it has the low possibility of producing element diffusion between the respective magnetic layers under heating, and causes no problem of change and deterioration in magnetic properties or breaking of the insulation layer.

The upper protective layer 37 is provided for setting the gap between the upper protective layer 37 and an upper shielding magnetic layer, and preventing oxidation of the ferromagnetic layer 34. The upper protective layer 37 preferably comprises an insulating material such as $Al_2O_3$, quartz or the like.

Figure 2:
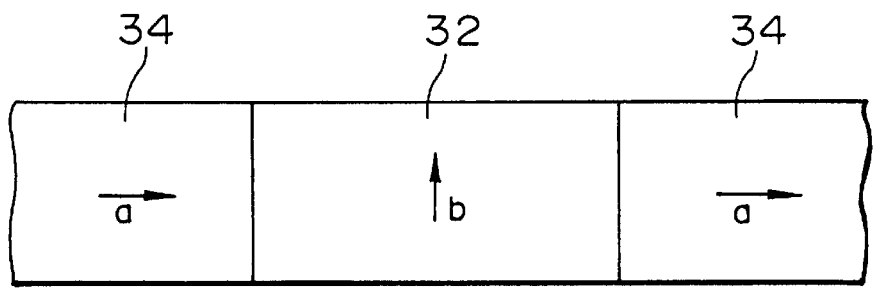
FIG. 2 is a drawing showing the magnetization direction of each of the ferromagnetic layers in the sensor shown in FIG. 1.

By providing the antiferromagnetic layers 35 on the ferromagnetic layer 34, a bias in the magnetization direction shown by an arrow a in FIG. 1 can be applied to the ferromagnetic layer 34 by imparting unidirectional anisotropy thereto to put the ferromagnetic layer 34 into a single magnetic domain state. The coercive force increasing layer 31 deposited over the entire surface of the ferromagnetic layer 32 can pin the magnetization direction of the ferromagnetic layer 32 to arrange the magnetization in the direction b perpendicular to the drawing of FIG. 1. Therefore, the magnetization direction of the ferromagnetic layer 34 is directed in the direction of the arrow a shown in FIGS. 1 and 2, and the magnetization direction of the ferromagnetic layer 32 is directed in the direction of the arrow b so that both magnetization directions can be made cross at substantially 90°.

In the structure shown in FIG. 1, a sensing current is supplied to the magnetoresistive element 30.

In the structure shown in FIG. 1, the coercive force of the ferromagnetic layer 32 is increased by exchange magnetic coupling in the presence of the coercive force increasing layer 31 to pin the magnetization direction of the ferromagnetic layer 32, and the magnetization direction of the other ferromagnetic layer 34 is freed in a region corresponding to the track width TW. As a result, a difference in coercive force occurs between the ferromagnetic layers 32 and 34, thereby obtaining the giant magnetoresistive effect. Namely, when an external magnetic field such as the leakage magnetic field from the recording magnetic medium which is moved in the Y direction acts on the central region corresponding to the track width TW in the ferromagnetic layer 34 having free magnetization rotation, the magnetization direction of the ferromagnetic layer 34 is easily rotated, and the resistance of the magnetoresistive element 30 easily changes with the rotation. Therefore, magnetic information of the recording magnetic medium can be read by measuring the change in resistance.

Also, since at the time of the change in resistance, the ferromagnetic layer 34 is put into a single magnetic domain state, and the longitudinal bias is applied thereto, the change in resistance can be obtained with good linear response without causing Barkhousen noise.

In the structure shown in FIG. 1, since the coercive force increasing layer 31 comprises $\alpha$-$Fe_2O_3$, which is an oxide and has excellent corrosion resistance and a high Neel temperature, as compared with FeMn, the structure has high resistance to a temperature change.

Figure 3:
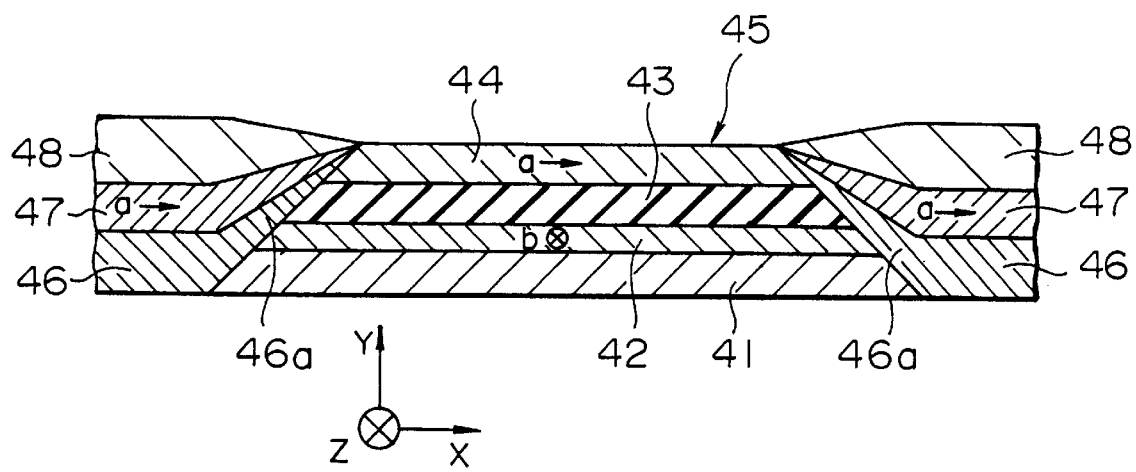
FIG. 3 is a sectional view showing a magnetoresistive sensor in accordance with a second embodiment of the present invention.

FIG. 3 shows a magnetoresistive sensor in accordance with another embodiment of the present invention. The magnetoresistive sensor of this embodiment comprises a coercive force increasing layer 41, a pinned ferromagnetic layer 42, a non-magnetic layer 43 and a free ferromagnetic layer 44, which constitute a laminate 45 having a trapezoidal section; antiferromagnetic layers 46 provided on both sides of the laminate 45; a ferromagnetic layer 47 and an electrically conductive layer 48 which are laminated on each of the antiferromagnetic layers 46. In this embodiment, the antiferromagnetic layers 46 are provided so that the ends thereof cover the sides of the antiferromagnetic layer 41, the pinned ferromagnetic layer 42 and the non-magnetic layer 43, and cover the sides of the free ferromagnetic layer 44 to about a half of the thickness thereof. The ferromagnetic layers 47 on the antiferromagnetic layers 46 are provided so that the ends thereof cover the sides of the free ferromagnetic layer 44 to about a half of the thickness thereof. The relation between the thicknesses of the respective layers is not limited to that shown in FIG. 1. The positions of the antiferromagnetic layers 46 and the ferromagnetic layers 37 may be reversed, or many antiferromagnetic layer 46 and the ferromagnetic layer 47 may be alternately laminated.

In the above-mentioned structure, the coercive force increasing layer 41, the pinned ferromagnetic layer 42, the non-magnetic layer 43, and the free ferromagnetic layer 44 comprise the same materials as the coercive force increasing layer 31, the ferromagnetic layer 32, the non-magnetic layer 33 and the ferromagnetic layer 34, respectively, used in the first embodiment. The antiferromagnetic layers 46 preferably comprise the same material as the antiferromagnetic layers 35 used in the first embodiment, and the ferromagnetic layers 47 preferably comprise a ferromagnetic layer of an amorphous material such as CoNbZr, CoFeB, CoFeZr or the like, or a laminated film comprising one of these layers and a crystalline film of a NiFe alloy or the like.

In the structure shown in FIG. 3, the magnetization direction of the ferromagnetic layers 47 can be pinned in the direction of the arrow a shown in FIG. 3 by the unidirectional anisotropy of the antiferromagnetic layers 46, and at the same time, the magnetization direction of the free ferromagnetic layer 44 can be directed to the same direction of the arrow a as the magnetization direction of the ferromagnetic layer 47, to apply the longitudinal bias to the free ferromagnetic layer 44. The magnetization direction of the pinned ferromagnetic layer 42 is pinned to the direction of the arrow b shown in FIG. 3 by the coercive force increasing layer 41.

As described above, the free ferromagnetic layer 44 and the ferromagnetic layers 47 can be put into a single magnetic domain region, and the magnetization direction of the free ferromagnetic layer 44 can be made cross the magnetization direction of the pinned ferromagnetic layer 42 at right angles.

When the ferromagnetic layers 47 comprise an amorphous ferromagnetic material, there is the advantage of introducing a sensor exhibiting less side reading (reading the magnetic field of the recording magnetic medium in a region other than the track region) and less dispersion in unidirectional anisotropy because the amorphous ferromagnetic layer has a little MR effect.

In the structure of this embodiment, since the free ferromagnetic layer 44 can be put into a single magnetic domain state to apply the longitudinal bias to the ferromagnetic layer 44, a change in resistance can be obtained with good linear response without causing Barkhausen noise, as in the structure of the first embodiment.

Figure 4:
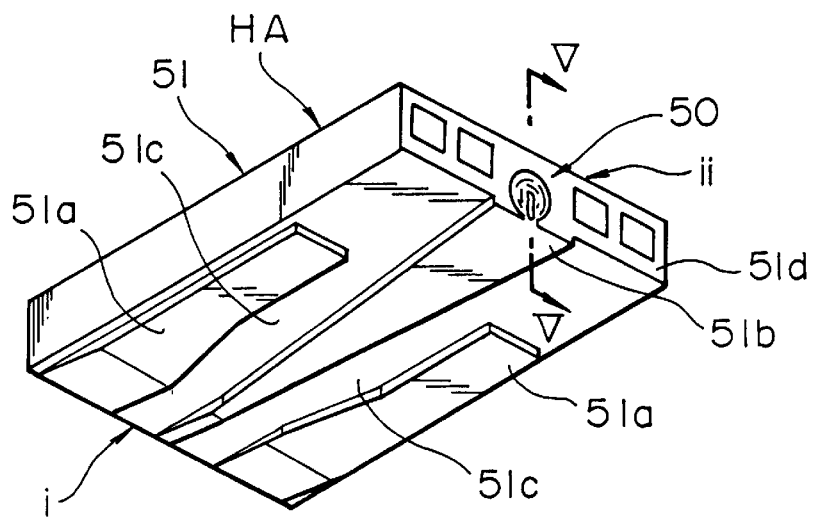
FIG. 4 is a perspective view showing a thin film magnetic head comprising a magnetoresistive sensor of the present invention.
Figure 5:
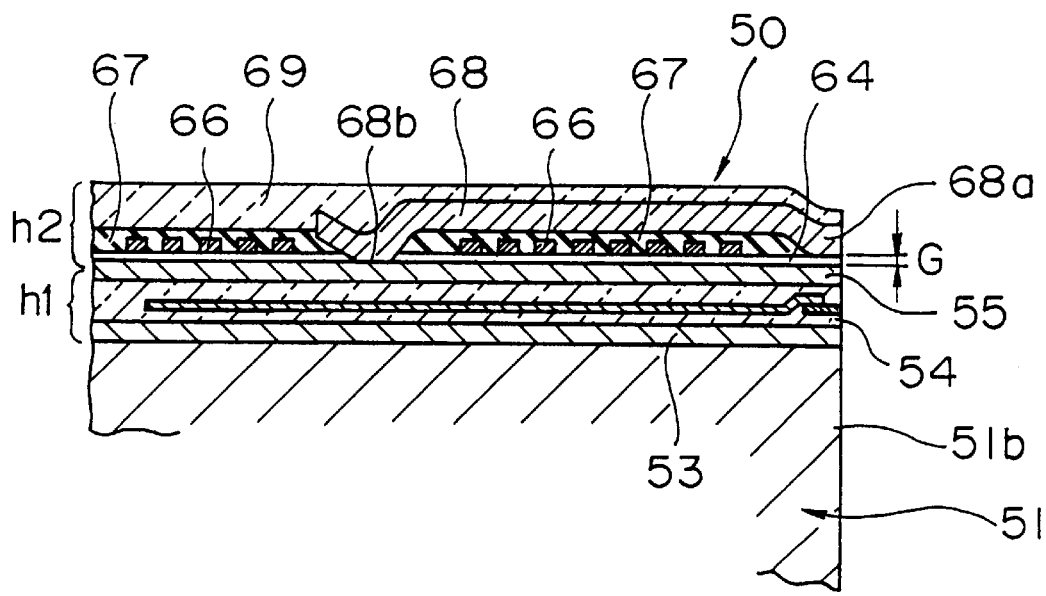
FIG. 5 is a sectional view showing a principal portion of the thin film magnetic head shown in FIG. 4.
Figure 6:
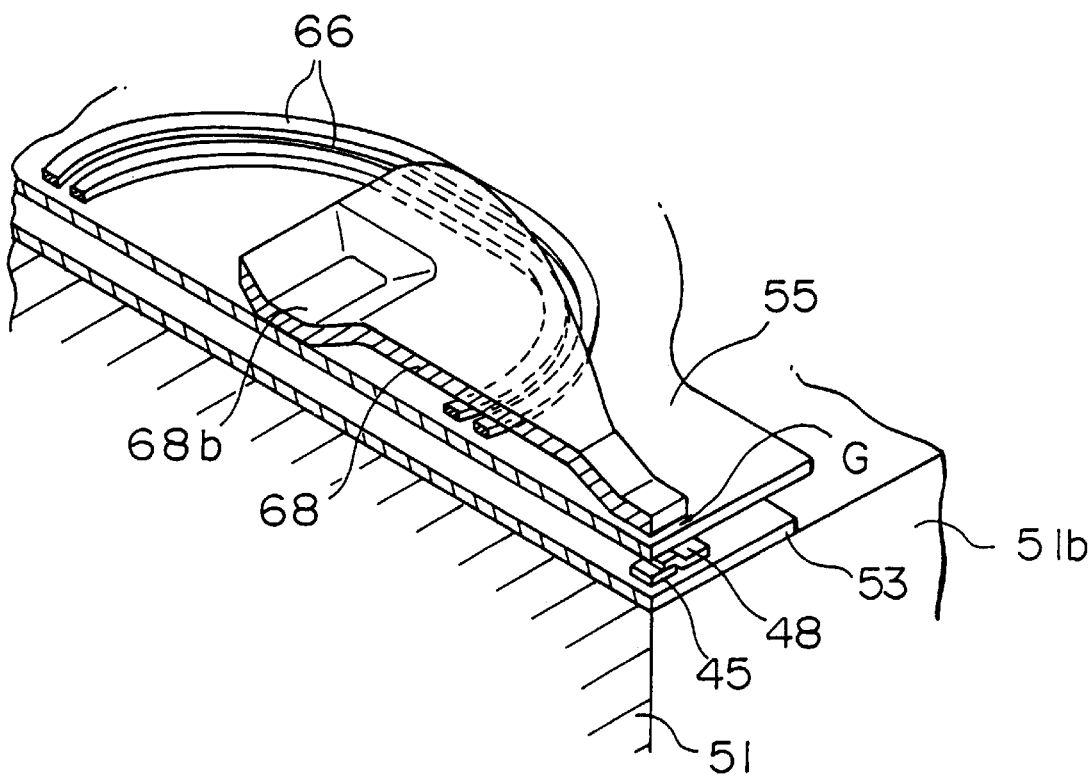
FIG. 6 is a perspective view showing the thin film magnetic head shown in FIG. 4, with a sectional portion.

FIGS. 4 to 6 shows an example of the structure of a thin film magnetic head having the element structure shown in FIG. 1 or 3.

The magnetic head HA of this example is a floating type which is loaded on a hard disk drive or the like. In a slider 51 of this magnetic head HA, the side shown by (i) in FIG. 4 is the leading side on the upstream side in the direction of movement of the disk surface, and the side shown by (ii) in FIG. 4 is the trailing side. On the side of the slider 51 opposite to a disk are formed rail-shaped ABS surfaces 51a and 51b, and an air groove 51c.

On the side 51d of the slider 51 on the trailing side is provided a thin film magnetic head 50.

The thin film magnetic head 50 of this example is a combination magnetic head having the sectional structures shown in FIGS. 5 and 6, and comprises a MR head (reading head) $h_1$ and an inductive head (writing head) $h_2$, which are laminated in turn on the side 51d of the slider 51 on the trailing side.

The MR head $h_1$ of this example detects the leakage magnetic field from the recording magnetic medium such as a disk or the like by using the magnetoresistive effect to read a magnetic signal. As shown in FIG. 5, the MR head $h_1$ comprises a lower gap layer 53 comprising a magnetic alloy such as sendust (Fe—Al—Si) and formed on the trailing side of the slider 51, and a upper gap layer 54 formed on the lower gap layer 53 and comprising a non-magnetic material such as aluminum oxide ($Al_2O_3$) or the like. On the upper gap layer 54 is laminated a magnetoresistive sensor having the structure shown in FIG. 1 or 3 and serving as a giant-magnetoresistive element. On the magnetoresistive sensor are further formed in turn an upper gap layer comprising alumina and an upper shielding layer. The upper shielding layer is also used as a lower core layer 55 of the inductive head $h_2$ provided on MR head $h_1$.

The inductive head $h_2$ comprises the lower core layer 55, a gap layer 64 formed on the lower core layer 55, and a coil layer 66 formed on the gap layer 64, patterned to a plane spiral form, and included in an insulating material layer 67. The end 68a of an upper core layer 68 formed on the insulating material layer 67 is opposite to the lower core layer 55 with a small gap therebetween on the ABS surface 51b, the base end 68b thereof being magnetically connected to the lower core layer 55. On the upper core layer 68 is provided a protective layer 69 comprising alumina or the like.

In the inductive head $h_2$, a recording current is given to the coil layer 66, and given to the core layer from the coil layer 66. A magnetic signal can thus be recorded on the recording magnetic medium such as a hard disk by the leakage magnetic field from the magnetic gap G between the ends of the lower core layer 55 and the upper core layer 68.

In the MR head $h_1$, since the resistance of the ferromagnetic layer 44 changes with the presence of the small leakage magnetic field from the recording magnetic medium such as the hard disk, recording contents of the recording medium can be read by reading the change in resistance.

Further, since the magnetic head HA constructed as described above comprises the magnetoresistive sensor having the above structure, it is possible to obtain a change in resistance with good linear response without Barkhausen noise, and a higher MR ratio than a conventional magnetic head. The magnetic head HA thus has the property of excellent reading performance.

The magnetoresistive sensor having the structure shown in FIG. 1 can be formed by placing a substrate of $Al_2O_3$—TiC in a chamber of high frequency magnetron sputtering equipment or ion-beam sputtering equipment, and depositing required layers in turn in an inert gas atmosphere of Ar gas or the like in the chamber. The required targets for depositing the layers are an α-$Al_2O_3$ target, a Ni—Fe alloy target, a Cu target, etc.

In manufacture of the magnetoresistive sensor of the present invention shown in FIG. 3, the coercive force increasing layer 41 comprising α-$Al_2O_3$ is formed on the substrate by sputtering while applying a magnetic field in the Z direction shown in FIGS. 1 and 3 in an atmosphere under an Ar gas pressure of 3 mTorr or less, the two ferromagnetic layers 42 and 44 are formed on the coercive force increasing layer 41 to hold the non-magnetic layer 43 therebetween, and at the same time, portions of these layers other than a portion thereof corresponding to the track width are removed by a photolithography process and an ion milling method to form the laminate 45.

The antiferromagnetic layers 46, the amorphous ferromagnetic layers 47 and the electrically conductive layers 48 are then laminated on both ends of the laminate 45 by sputtering while applying a magnetic field at right angles with the direction of previous application of the magnetic field. A magnetic field in the direction perpendicular to the drawing of FIG. 3 is then applied for permanent magnetization of the pinned ferromagnetic layer 42.

The above-described treatment permits achievement of the magnetoresistive sensor having the structure shown in FIG. 3 in which the magnetization direction of the pinned ferromagnetic layer 42 crosses at 90° the magnetization direction of the ferromagnetic layer 44.

In manufacture of the magnetoresistive sensor having the structure shown in FIG. 1, the coercive force increasing layer 31, the ferromagnetic layer 32, the non-magnetic layer 33 and the ferromagnetic layer 34 are laminated, and then the antiferromagnetic layers and the electrically conductive layers are laminated. The central portions of the ferromagnetic layers and the electrically conductive layers are removed by the photolithographic process, and the upper protective layer 37 is formed thereon. In formation of each of these layers, the coercive force increasing layer 31 is deposited while applying a magnetic field in the direction corresponding to the Z direction shown in FIGS. 1 and 3, and the antiferromagnetic layers 35 are deposited while applying a magnetic field in the direction corresponding to the X direction shown in FIGS. 1 and 3. Finally, a magnetic field in the direction perpendicular to the drawing of FIG. 1 is applied for permanent magnetization of the pinned ferromagnetic layer 32.

The above-described treatment permits achievement of the magnetoresistive sensor having the structure shown in FIG. 1 in which the magnetization direction of the pinned ferromagnetic layer 32 crosses at 90° the magnetization direction of the ferromagnetic layer 34.

EXAMPLES

On an $Al_2O_3$—TiC substrate coated with an $Al_2O_3$ film was formed a laminate having the structure below by using high frequency magnetron sputtering equipment and a plurality of targets to manufacture a magnetoresistive sensor having the structure shown in FIG. 3.

In this process, a coercive force increasing layer of $\alpha\text{-}Fe_2O_3$, a ferromagnetic layer of an $Ni_{80}Fe_{20}$ alloy, a non-magnetic layer of Cu, a ferromagnetic layer of an $Ni_{80}Fe_{20}$ alloy and a protective layer of Ta had thicknesses of 500 Å, 30 Å, 20 Å, 75 Å and 30 Å, respectively. In order to provide the pinned ferromagnetic layer with anisotropy in the direction of the arrow b shown in FIG. 3, this layer was deposited while applying a magnetic field of 200 Oe in the direction of the arrow b.

Both end portions of the thus-obtained laminate were removed by the photolithography process and the ion milling method, leaving a portion having a track width (the width of the magnetic sensing portion) of 2 μm. On both sides of the left magnetic sensing portion were laminated, by sputtering, antiferromagnetic layers ($Pt_{50}Mn_{50}$) having a thickness of 300 Å, amorphous layers ($Co_{88}Nb_8Zr_4$) having a thickness of 200 Å, and electrically conductive layers having a thickness of 700 Å. In this lamination, a magnetic field of 200 Oe was applied in the direction at 90° with the direction of the previous applied magnetic field.

Finally, patterning is carried out so that a track width of 2 μm, and a height (the height in the direction perpendicular to the drawing of FIG. 3) of 1 μm were obtained, and a magnetic field of 2 kOe was applied in the height direction (the direction perpendicular to the drawing of FIG. 3) for permanent magnetization of the pinned ferromagnetic layer.

In some samples, annealing in a magnetic field was carried out at 250° C. for 5 hours while applying a magnetic field in the direction of the track width (the lateral direction of FIG. 3) before permanent magnetization in the height direction.

The magnetoresistance curve of the magnetoresistive sensor sample obtained by the above manufacturing method was measured in a low magnetic field. The results obtained are shown in Table 1 and FIG. 7. In this measurement, the magnetic field was applied in the height direction.

TABLE 1

| Ferromagnetic layer | Magneto-resistance ratio (±50 Oe) | Linearity (±50 Oe) | Hysteresis | Barkhausen noise |
|---|---|---|---|---|
| $Pt_{50}Mn_{50}$ | 3.1% | good | no | no |
| $Pd_{50}Mn_{50}$ | 3.6% | good | no | no |
| $Pd_{30}Pt_{20}Mn_{50}$ | 3.0% | good | no | no |
| $Ni_{50}Mn_{50}$ | 2.8% | good | no | no |
| $Ru_{50}Mn_{50}$ | 3.4% | good | no | no |
| $Cr_{52}Mn_{48}$ | 2.8% | good | no | no |
| $Fe_{51}Mn_{49}$ | 2.9% | good | no | no |
| $Ir_{15}Mn_{85}$ | 3.1% | good | no | no |
| $Rh_{20}Mn_{80}$ | 3.0% | good | no | no |

Figure 7:
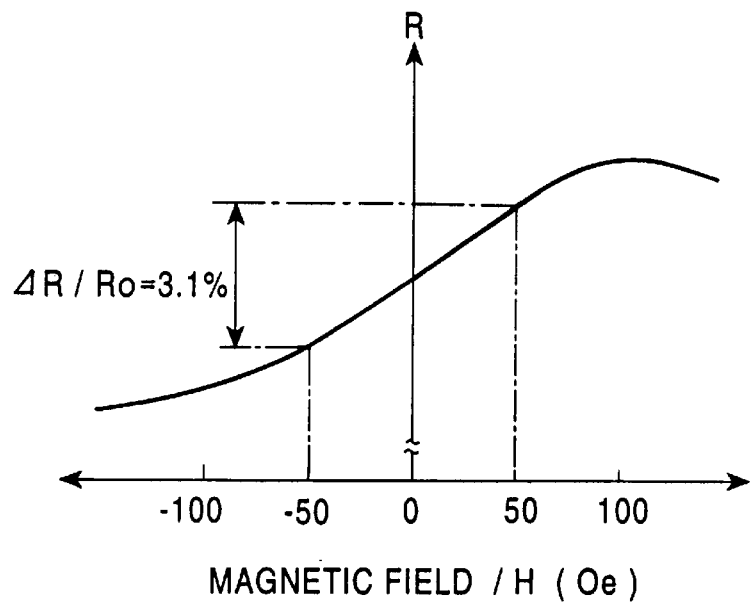
FIG. 7 is a graph showing the curve of resistance change of an example sample.

FIG. 7 indirectly shows that the resistance value in zero magnetic field is at substantially the center between the maximum and minimum resistance values, and the magnetization directions cross at right angles. Since the resistance value in zero magnetic field is at substantially the center, it can be said that even if an external magnetic field changes within the range of about ±50 Oe, linearity is good, and the dynamic range is wide. It is also found that the sample exhibits neither hysteresis nor Barkhausen noise, and thus has preferable properties as a reading magnetic head.

The results indicate that the magnetoresistance ratio within the range of ±50 Oe is 3.1%, and the output is very high. Other samples were manufactured by the same method as described above except that the antiferromagnetic layers were deposited by respectively using PdMn, PdPtMn, NiMn, RuMn, CrMn, FeMn, IrMn, and RhMn in place of PtMn, and then measured by the same method. Table 1 indicates that the other samples also have excellent effects.

Figure 8:
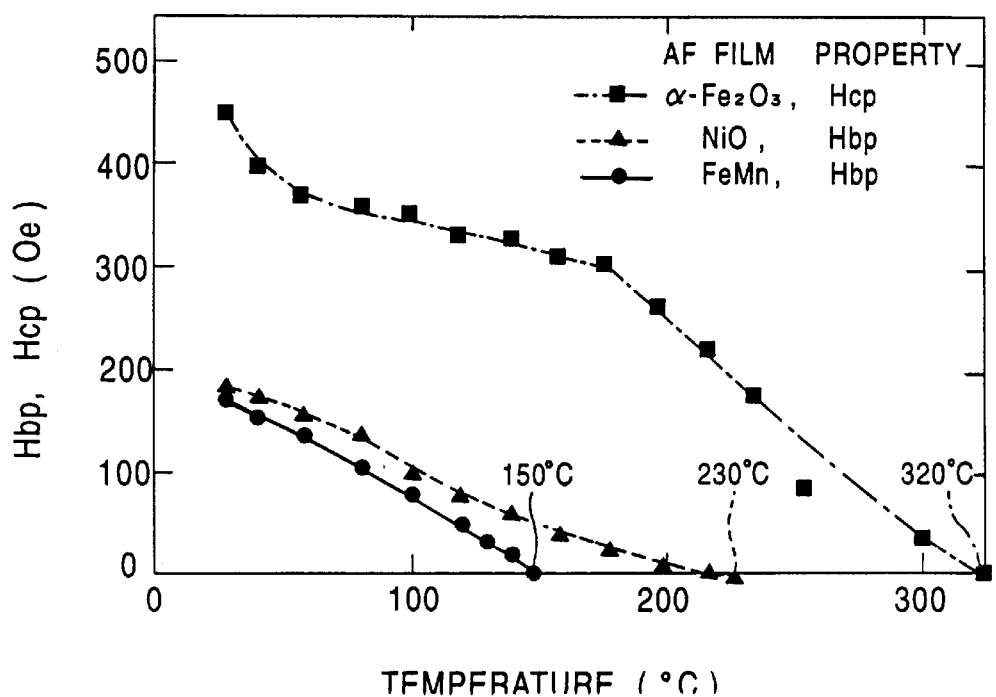
FIG. 8 is a graph showing the blocking temperatures of magnetoresistive sensor samples using $\alpha\text{-Fe}_2\text{O}_3$.

FIG. 8 shows the blocking temperature Tb of a magnetoresistive sensor sample comprising $\alpha\text{-}Fe_2O_3$ which was previously proposed by the inventors in Japanese Document No. A2 8-7235. For comparison, FIG. 8 also shows the temperature properties of a sample having the comparative structure (a laminate of NiFe/Cu/NiFe/FeMn (110 Å) and a laminate of NiFe/Cu/CoPt (80 Å)) disclosed in Japanese Document No. A2 8-7235, and a sample comprising NiO in place of FeMn. In FIG. 8, Hbp represents a bias magnetic field where the magnetization reversal of the NiFe film adjacent to the antiferromagnetic film was shifted, and Hcp represents the coercive force by this hysteresis.

The results shown in FIG. 8 indicate that the magnetoresistive sensor sample comprising $\alpha\text{-}Fe_2O_3$ also has excellent heat resistance. This is possibly due to the fact that the Neel temperature (677° C.) of $\alpha$-$Fe_2O_3$ is higher than those of FeMn and NiO.

Therefore, the magnetoresistive sensor sample comprising $\alpha$-$Fe_2O_3$ can provide a magnetoresistive sensor exhibiting less deterioration in properties due to a temperature change.

Figure 9A:
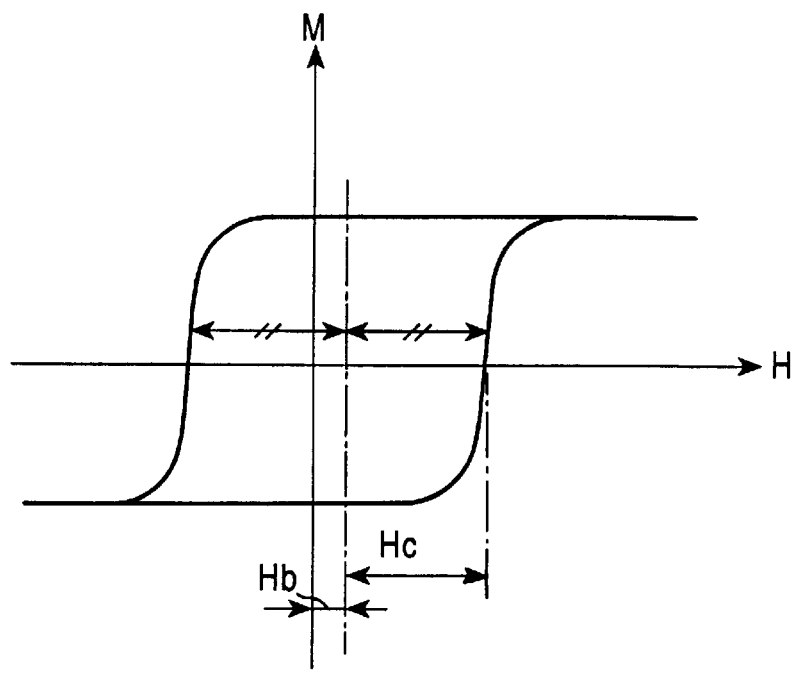
FIG. 9A is a drawing showing the magnetizing curve of a pinned ferromagnetic layer.
Figure 9B:
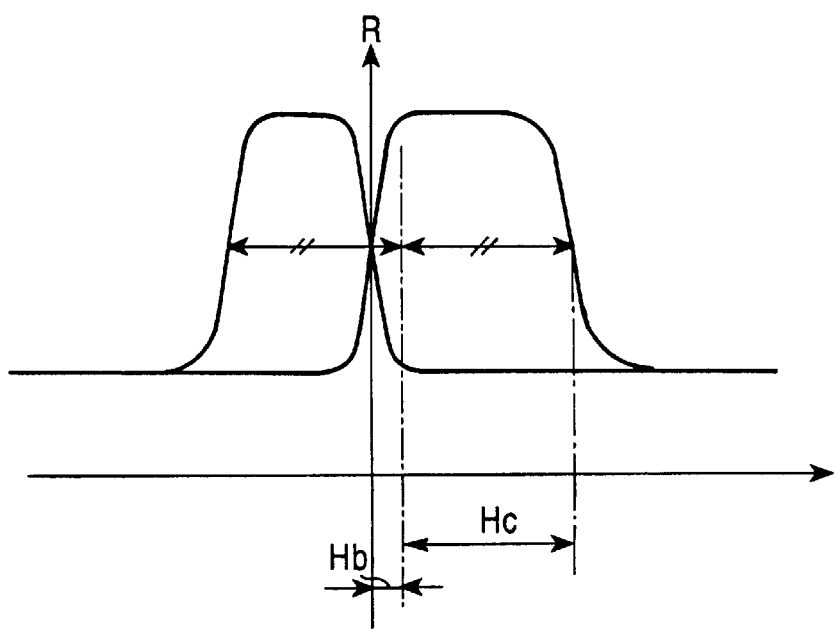
FIG. 9B is a drawing showing the magnetoresistance curve of a magnetoresistive sensor.
Figure 10:
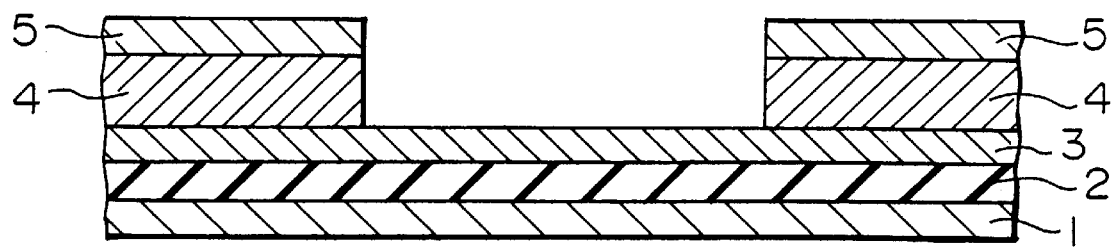
FIG. 10 is a sectional view showing a first example of conventional magnetoresistive sensors.
Figure 10:
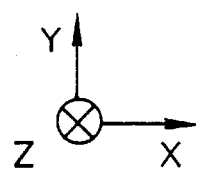
Figure 11:
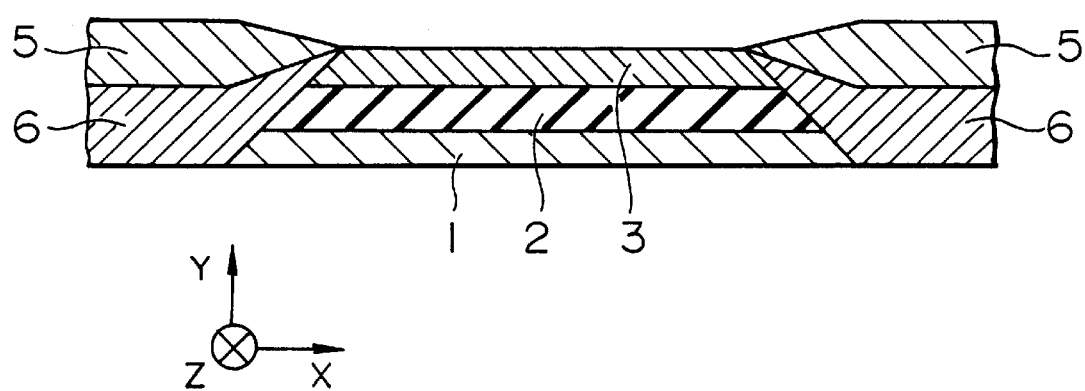
FIG. 11 is a sectional view showing a second example of conventional magnetoresistive sensors.
Figure 11:
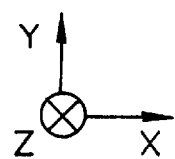
Figure 12:
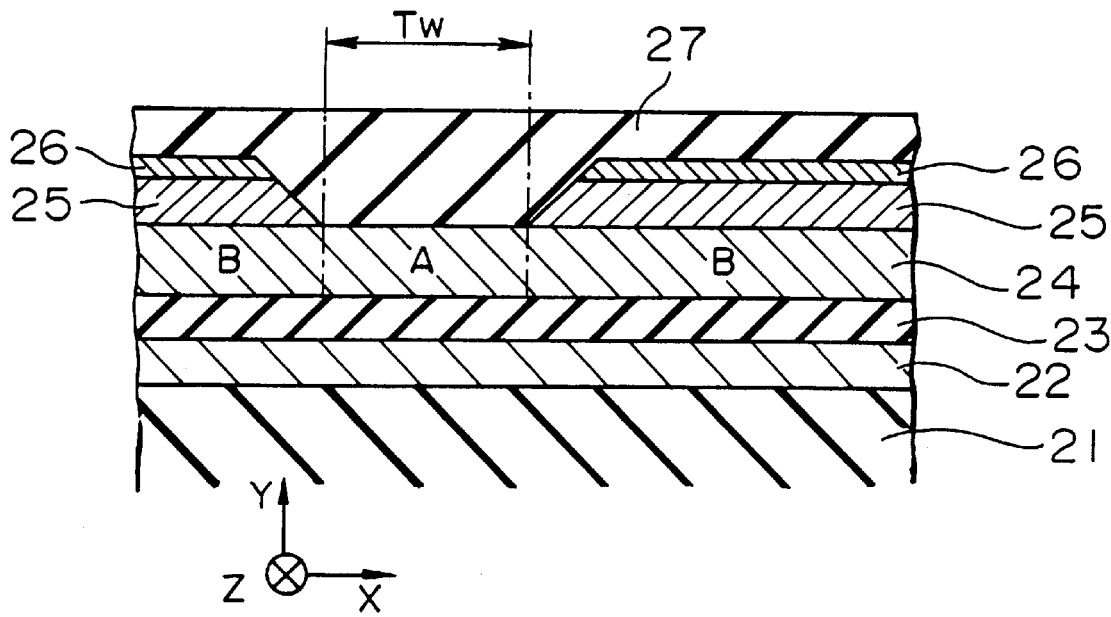
FIG. 12 is a sectional view showing a third example of conventional magnetoresistive sensors.
Figure 13:
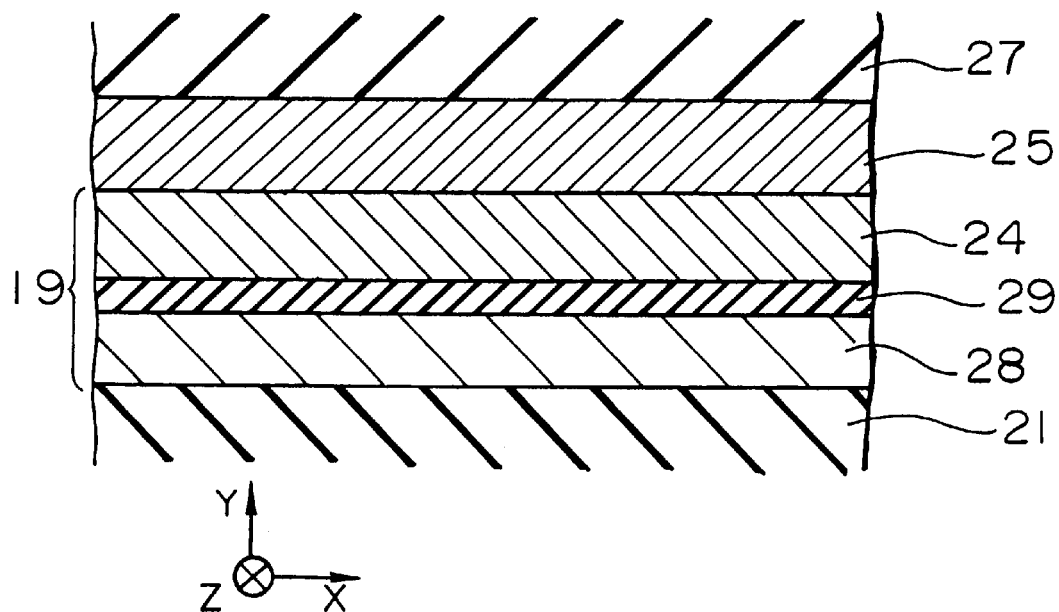
FIG. 13 is a sectional view showing a fourth example of conventional magnetoresistive sensors.
Figure 14:
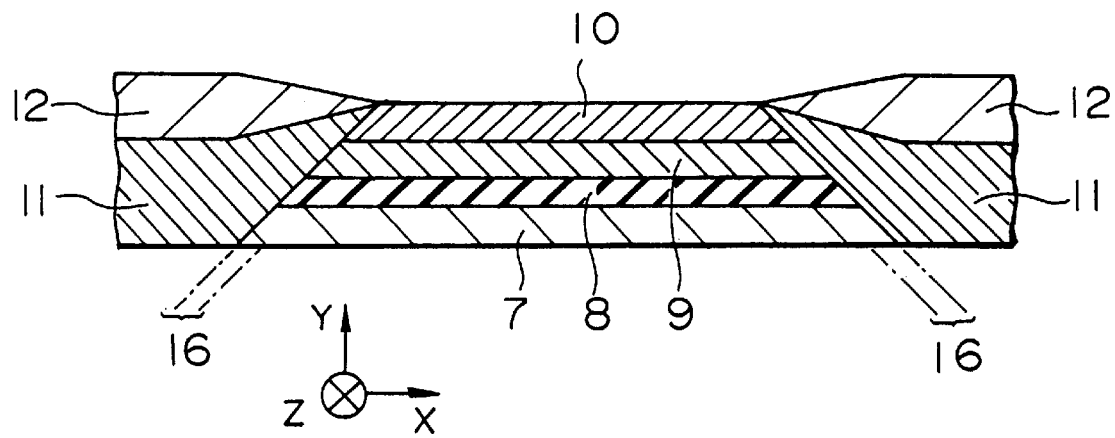
FIG. 14 is a sectional view showing a fifth example of conventional magnetoresistive sensors.
Figure 15:
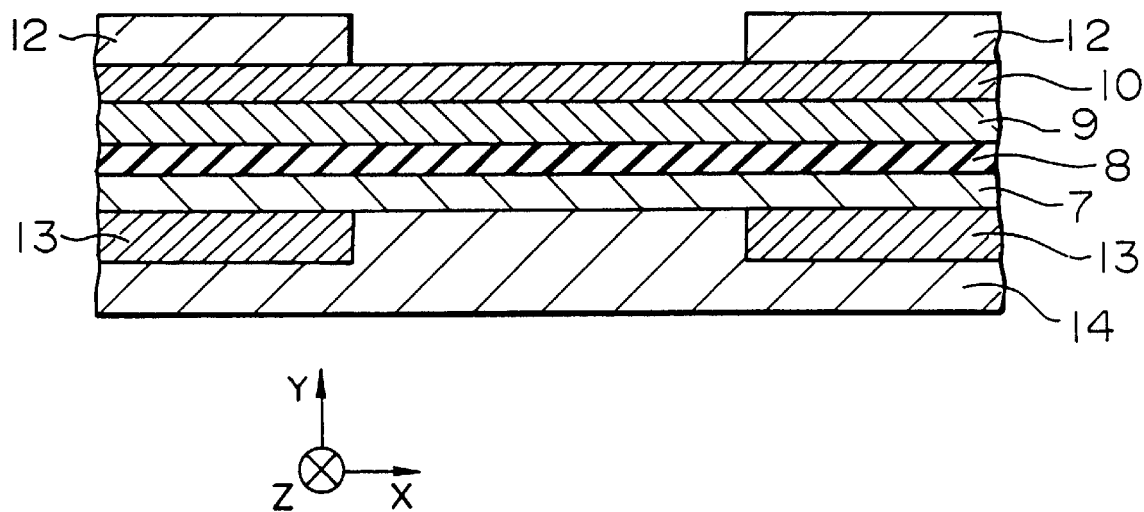
FIG. 15 is a sectional view showing a sixth example of conventional magnetoresistive sensors.

FIG. 9A shows the magnetizing curve of the pinned ferromagnetic layer adjacent to the coercive force increasing layer ($\alpha$-$Fe_2O_3$ or the like), and FIG. 9B shows the magnetoresistance curve of a spin-valve magnetoresistive sensor comprising the same pinned ferromagnetic layer. Each of FIGS. 9A and B show the values of the coercive force ($H_c$) and the exchange bias magnetic field ($H_b$) which have the relation of $H_c > H_b$. On the other hand, the ferromagnetic layers adjacent to the antiferromagnetic layers 46 have the reverse relation $H_c < H_b$. In this case, unidirectional anisotropy is produced. In this specification, it is defined that unidirectional anisotropy occurs in the ferromagnetic layer having such a relation.

As described above, in the present invention, the ferromagnetic layers provided adjacent to the magnetoresistive element in the magnetic sensing region comprises an amorphous thin film. Since the amorphous ferromagnetic layer has a little MR effect, it is possible to produce a sensor having less side reading (reading a magnetic field of a recording magnetic medium in a region other than the track region) and less dispersion of unidirectional anisotropy.

The use of the antiferromagnetic layer for applying the longitudinal bias, which comprises X—Mn (wherein X indicates at least one of Pt, Pd, Ir, Ru and Rh) can provide a sensor having excellent corrosion resistance and less changes in the exchange anisotropic magnetic field with temperature changes. Within a composition range of X—Mn system alloys, a film of this alloy deposited by sputtering or the like can be used without any special heat treatment, and thus heat treatment conditions can be moderated, as compared with a conventional structure.

In use of the magnetoresistive sensor having the above structure as a magnetic head, the resistance changes in linear response to a small leakage magnetic field from a recording magnetic medium, and thus it is possible to provide a magnetic head capable of reading magnetic information with good sensitivity and no Barkhausen noise.

The unidirectional magnetic anisotropy induced in the ferromagnetic layer having free magnetization reversal, which is adjacent to the antiferromagnetic layer for applying the longitudinal bias, is produced by forming the ferromagnetic layer while applying a magnetic field thereto or performing heat treatment in a magnetic field after the formation of the ferromagnetic layer. In addition, the magnetization direction of the ferromagnetic layer having pinned magnetization reversal, which is adjacent to the coercive force increasing layer, is determined in the permanent magnetization process performed after the process for determining the magnetic anisotropy of the ferromagnetic layer having free magnetization reversal. It is thus possible to make the magnetization direction of the ferromagnetic layer having pinned magnetization reversal substantially perpendicular to the magnetization direction of the ferromagnetic layer having free magnetization reversal, and obtain a magnetoresistive sensor to which the longitudinal bias was applied.

Further, the unidirectional magnetic anisotropy induced in the ferromagnetic layer, which is adjacent to the antiferromagnetic layer to form a laminate, is produced by forming the ferromagnetic layer while applying a magnetic field thereto or performing heat treatment in a magnetic field after the formation of the ferromagnetic layer, and the magnetization direction of the ferromagnetic layer adjacent to the coercive force increasing layer and having pinned magnetization reversal is determined by the permanent magnetization process after the precess for determining the magnetic anisotropy of the ferromagnetic layer of the laminate. It is thus possible to make the magnetization direction of the ferromagnetic layer having pinned magnetization reversal substantially perpendicular to the magnetization direction of the ferromagnetic layer having free magnetization reversal, and obtain a magnetoresistive sensor to which the longitudinal bias was applied.

In the present invention, the antiferromagnetic layer comprising an antiferromagnetic material is provided for inducing the unidirectional magnetic anisotropy in the ferromagnetic layer having free magnetization reversal to stabilize the magnetic domain thereof. Therefore, it is possible to put the ferromagnetic layer into a single magnetic domain state. In addition, the magnetization direction of the ferromagnetic layer can be differentiated from the magnetization direction of the ferromagnetic layer having pinned magnetization reversal by an external magnetic field to produce a change in resistance. The external magnetic field can be detected by this change in resistance with good sensitivity, and the Barkhausen noise can be eliminated. Further, when the ferromagnetic layer is put into a single magnetic domain state, a magnetic field can be detected with excellent linear response.

Since the magnetization direction of the ferromagnetic layer having pinned magnetization reversal is at 90° with the magnetization direction of the ferromagnetic layer having free magnetization reversal, a high magnetoresistance ratio can be obtained efficiently.

When using an $\alpha$-$Fe_2O_3$ layer as the antiferromagnetic layer for pinning the magnetization direction, it is possible to provide a magnetoresistive sensor having high resistance to thermal changes and exhibiting no decrease in sensitivity by thermal changes because of the high Neel temperature of $\alpha$-$Fe_2O_3$.

Further, the antiferromagnetic layers for applying the longitudinal bias are provided on both sides of the sensing region of the ferromagnetic layer having free magnetization reversal with a space therebetween which equals to the predetermined track width corresponding to the width of the sensing region so as to be adjacent to the ferromagnetic layer. Therefore, the longitudinal bias can be applied to both sides of the sensing region of the ferromagnetic layer due to the unidirectional magnetic anisotropy, and magnetization reversal of the magnetic sensing region of the ferromagnetic layer is facilitated. It is thus possible to obtain a change in resistance with good linear response and without Barkhausen noise when the longitudinal bias is applied.

Further, the ferromagnetic layer having free magnetization reversal is formed with the width of the magnetic sensing region corresponding to the track width, and a laminate of the antiferromagnetic layer comprising an antiferromagnetic material and another ferromagnetic layer is formed on either side of the ferromagnetic layer having free magnetization reversal. Thus, the longitudinal bias can be applied to the ferromagnetic layer due to the unidirectional magnetic anisotropy, and magnetization reversal of the ferromagnetic layer is facilitated. It is thus possible to obtain a change in resistance with good linear response and without Barkhausen noise when the longitudinal bias is applied.

What is claimed is:

1. A method of manufacturing a magnetoresistive sensor comprising:

providing at least two ferromagnetic layers with a non-magnetic layer therebetween;

providing a coercive force increasing layer comprising a first antiferromagnetic material adjacent to one of the ferromagnetic layers, for increasing the coercive force of the ferromagnetic layer to pin the magnetization reversal thereof, the other ferromagnetic layer having free magnetization reversal; and providing an antiferromagnetic layer comprising a second antiferromagnetic material adjacent to the other ferromagnetic layer having free magnetization reversal, for applying a longitudinal bias to the other ferromagnetic layer to induce magnetic anisotropy due to a unidirectional exchange bias magnetic field to stabilize a magnetic domain;

wherein the magnetization direction of the ferromagnetic layer having pinned magnetization reversal crosses at substantially right angles the magnetization direction of the ferromagnetic layer having free magnetization reversal without an external magnetic field, the second antiferromagnetic layer for applying the longitudinal bias is formed on either side of the magnetic sensing region of the ferromagnetic layer having free magnetization reversal with a space therebetween, which equals to a predetermined track width corresponding to the width of the magnetic sensing region, so as to be adjacent to the ferromagnetic layer, the unidirectional magnetic anisotropy induced in the other ferromagnetic layer having free magnetization reversal and provided adjacent to the second antiferromagnetic layer for applying the longitudinal bias is produced by forming the other ferromagnetic layer while applying a magnetic field thereto or performing heat treatment in a magnetic field after formation of the other ferromagnetic layer, and the magnetization direction of the ferromagnetic layer having pinned magnetization reversal and adjacent to the coercive force increasing layer is determined in a permanent magnetization step after a step for determining the direction of the magnetic anisotropy of the other ferromagnetic layer having free magnetization reversal.

2. A method of manufacturing a magnetoresistive sensor according to claim 1, wherein the coercive force increasing layer comprises $\alpha\text{-Fe}_2\text{O}_3$, and the coercive force of the ferromagnetic layer having pinned magnetization reversal is larger than the unidirectional exchange bias magnetic field induced in the ferromagnetic layer by the coercive force increasing layer.

3. A method of manufacturing a magnetoresistive sensor comprising:

providing at least two ferromagnetic layers with a non-magnetic layer therebetween;

providing a coercive force increasing layer comprising a first antiferromagnetic material adjacent to one of the ferromagnetic layers, for increasing the coercive force of the ferromagnetic layer to pin magnetization reversal thereof, the other ferromagnetic layer having free magnetization reversal; and providing an antiferromagnetic layer comprising a second antiferromagnetic material adjacent to the other ferromagnetic layer having free magnetization reversal, for applying a longitudinal bias thereto to induce magnetic anisotropy due to a unidirectional exchange bias magnetic field to stabilize a magnetic domain;

wherein the magnetization direction of the ferromagnetic layer having pinned magnetization reversal crosses at substantially right angles the magnetization direction of the ferromagnetic layer having free magnetization reversal without an external magnetic field, the ferromagnetic layer having free magnetization reversal is formed with the width of a magnetic sensing region corresponding to a track width, a laminate of an antiferromagnetic layer and another ferromagnetic layer laminated thereon is formed on either side of the ferromagnetic layer having free magnetization reversal to apply a longitudinal bias to the ferromagnetic layer having free magnetization reversal, the unidirectional magnetic anisotropy induced in the ferromagnetic layer which is provided to form each of the laminates adjacent to the second antiferromagnetic layer for applying the longitudinal bias is produced by forming the ferromagnetic layer while applying a magnetic field or performing heat treatment in a magnetic field after formation of the ferromagnetic layer, and the magnetization direction of the ferromagnetic layer having pinned magnetization reversal and adjacent to the coercive force increasing layer is determined by a permanent magnetization step after a step for determining the magnetic anisotropy of the ferromagnetic layer of each laminate.

4. A method of manufacturing a magnetoresistive sensor according to claim 3, wherein the coercive force increasing layer comprises $\alpha\text{-Fe}_2\text{O}_3$, and the coercive force of the ferromagnetic layer having pinned magnetization reversal is larger than the unidirectional exchange bias magnetic field induced in the ferromagnetic layer by the coercive force increasing layer.

* * * * *